US011380806B2

(12) United States Patent
Gossner et al.

(10) Patent No.: US 11,380,806 B2
(45) Date of Patent: Jul. 5, 2022

(54) VARIABLE CAPACITANCE DEVICE WITH MULTIPLE TWO-DIMENSIONAL ELECTRON GAS (2DEG) LAYERS

(71) Applicant: INTEL CORPORATION, Santa Clara, CA (US)

(72) Inventors: Harald Gossner, Riemerling (DE); Peter Baumgartner, Munich (DE); Uwe Hodel, Putzbrunn (DE); Domagoj Siprak, Munich (DE); Stephan Leuschner, Munich (DE); Richard Geiger, Munich (DE); Han Wui Then, Portland, OR (US); Marko Radosavljevic, Portland, OR (US); Sansaptak Dasgupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/641,222

(22) PCT Filed: Sep. 28, 2017

(86) PCT No.: PCT/US2017/054155
§ 371 (c)(1),
(2) Date: Feb. 21, 2020

(87) PCT Pub. No.: WO2019/066874
PCT Pub. Date: Apr. 4, 2019

(65) Prior Publication Data
US 2020/0220030 A1 Jul. 9, 2020

(51) Int. Cl.
*H01L 29/93* (2006.01)
*H01L 29/06* (2006.01)
(Continued)

(52) U.S. Cl.
CPC .......... *H01L 29/93* (2013.01); *H01L 29/0649* (2013.01); *H01L 29/2003* (2013.01); *H01L 29/778* (2013.01)

(58) Field of Classification Search
CPC . H01L 29/93; H01L 29/0649; H01L 29/2003; H01L 29/778
(Continued)

(56) References Cited

U.S. PATENT DOCUMENTS 9,087,889 B2 * 7/2015 Nakajima ........... H01L 29/7782
2004/0135169 A1 7/2004 Yoshii et al.
(Continued)

FOREIGN PATENT DOCUMENTS

JP 2013041986 2/2013
KR 20160083256 7/2016

OTHER PUBLICATIONS

International Preliminary Report on Patentability from PCT/US2017/054155 dated Apr. 9, 2020, 11 pgs.
(Continued)

*Primary Examiner* — Tan N Tran
(74) *Attorney, Agent, or Firm* — Essential Patents Group, LLP

(57) ABSTRACT

A variable capacitance III-N device having multiple two-dimensional electron gas (2DEG) layers are described. In some embodiments, the device comprises a first source and a first drain; a first polarization layer adjacent to the first source and the first drain; a first channel layer coupled to the first source and the first drain and adjacent to the first polarization layer, the first channel layer comprising a first 2DEG region; a second source and a second drain; a second polarization layer adjacent to the second source and the second drain; and a second channel layer coupled to the second source and the second drain and adjacent to the second polarization layer, the second channel layer comprising a second 2DEG region, wherein the second channel layer is over the first polarization layer.

13 Claims, 13 Drawing Sheets

(51) Int. Cl.
*H01L 29/20* (2006.01)
*H01L 29/778* (2006.01)

(58) Field of Classification Search
USPC .......................................................... 257/595
See application file for complete search history.

(56) References Cited

U.S. PATENT DOCUMENTS

| | | |
|---|---|---|
| 2013/0043485 A1 | 2/2013 | Bateman |
| 2013/0099245 A1* | 4/2013 | Ando .................... H01L 29/205 257/76 |
| 2013/0175544 A1* | 7/2013 | Oishi .................. H01L 21/0254 257/76 |
| 2013/0221409 A1 | 8/2013 | Nakajima et al. |
| 2013/0313561 A1* | 11/2013 | Suh ....................... H01L 29/402 257/76 |
| 2014/0266324 A1 | 9/2014 | Teo et al. |
| 2016/0268410 A1* | 9/2016 | Onizawa ........... H01L 29/42376 |

OTHER PUBLICATIONS

International Search Report and Written Opinion for International Patent Application No. PCT/US17/54155, dated Jun. 28, 2018.
Chu, et al., "A Novel RF High-Q Metal-Semiconductor-Metal Planar Inter-Digitated Varactor Based on Double-Channel AlGaN/GaN HEMT Structure", IEEE Radio Frequency Integrated Circuits Symposium, pp. 385-388; 2005.

\* cited by examiner

VARIABLE CAPACITANCE DEVICE WITH MULTIPLE TWO-DIMENSIONAL ELECTRON GAS (2DEG) LAYERS

CLAIM OF PRIORITY

This Application is a National Stage Entry of, and claims priority to, PCT Application No. PCT/US17/54155, filed on 28 Sep. 2017 and titled "VARIABLE CAPACITANCE DEVICE WITH MULTIPLE TWO-DIMENSIONAL ELECTRON GAS (2DEG) LAYERS", which is incorporated by reference in its entirety for all purposes.

BACKGROUND

In various computing system applications, a variable capacitance device (e.g., a varactor) may be used. In a basic, cost optimized Gallium nitride (GaN) technology based device, there may not be a p-doping device available (e.g., due to relative complexity of activating p dopants in GaN). This may lead to a lack of a pn diode in GaN technology based devices. However, in some examples, pn junctions may be used in varactors, e.g., where the capacitance may be modulated by applying a reverse bias to a p-n-depletion region. Accordingly, GaN devices may not be usually used to form varactors.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
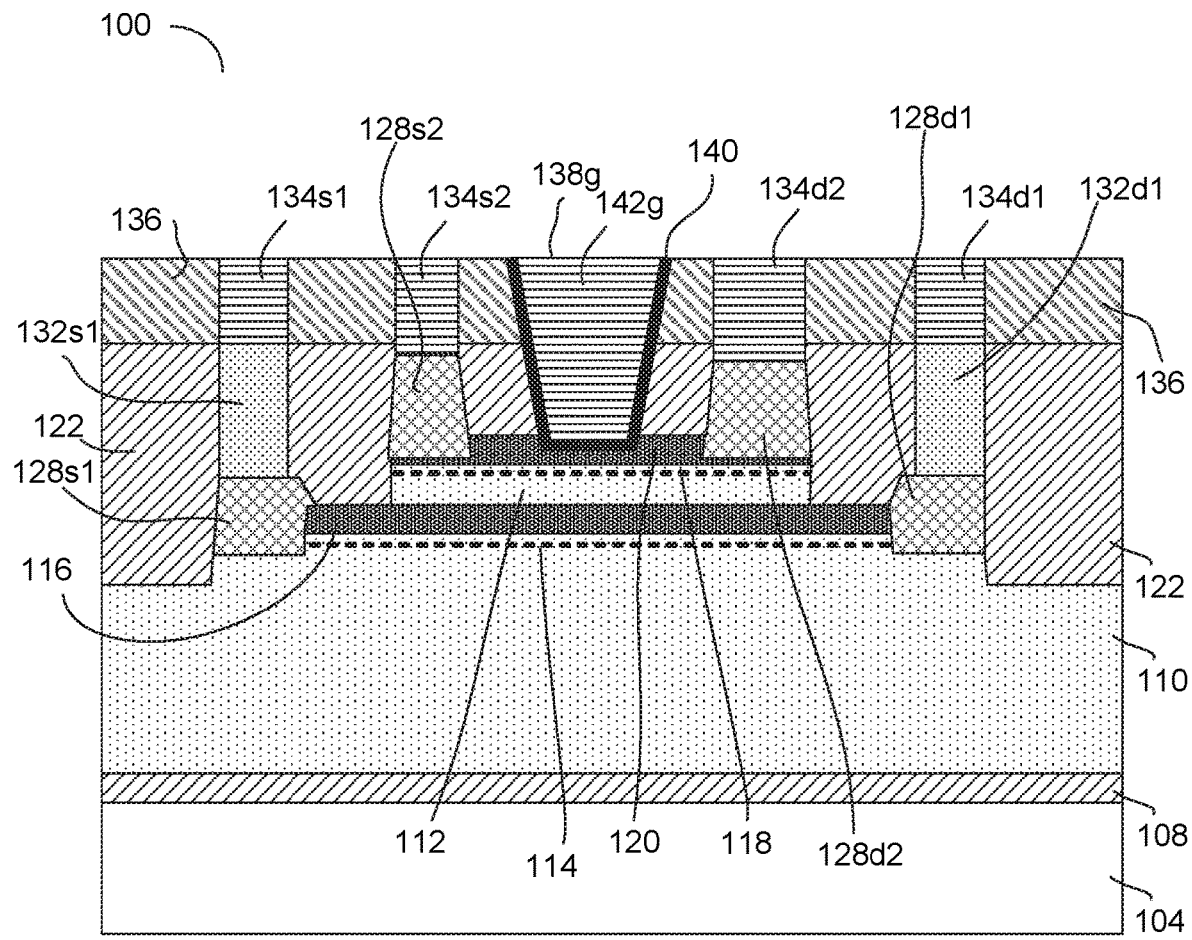
FIG. 1 is a cross-sectional view of a variable capacitance GaN device with multiple stacked two-dimensional electron gas (2DEG) regions, in accordance with some embodiment.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or materials disposed over or under another may be directly in contact or may have one or more intervening materials. Moreover, one material disposed between two materials may be directly in contact with the two layers or may have one or more intervening layers. In contrast, a first material "on"

a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

A variable capacitance GaN device with multiple stacked two-dimensional electron gas (2DEG) regions are described herein. For example, the device may comprise a first GaN channel layer and an adjacent first polarization layer, resulting in a formation of a first 2DEG region within the first channel layer near the heterojunction. The device may also comprise a second GaN channel layer and an adjacent second polarization layer, resulting in a formation of a second 2DEG region within the second channel layer near the heterojunction. Each 2DEG region may have corresponding source and drain. A gate stack may be recessed on the second polarization layer. A capacitance between the gate stack and the first 2DEG region, and a capacitance between the gate stack and the second 2DEG region may be fine-tuned, thereby providing a variable capacitance device.

FIG. 1 is a cross-sectional view of a variable capacitance GaN device 100 (e.g., also referred to as a device 100, or as a varactor 100) with multiple stacked 2DEG regions, in accordance with some embodiments. The device 100 may be formed over a substrate 104. In an example, the substrate 104 may be substantially monocrystalline with a predetermined crystal orientation. Substrate 104 may comprise a variety of materials, including, but not limited to, GaN, SiC, sapphire, and/or silicon. Silicon may be advantageous for monolithic integration of the device 100 with conventional silicon CMOS and for such embodiments, the substrate crystallographic orientation may be any of (100), (111), (110). Other crystallographic orientations may also be possible, and a range of miscut (e.g., 4-11°) may be utilized for better lattice matching between substrate 104 and an overlying semiconductor buffer 108.

The semiconductor buffer 108 formed on the substrate 104 may have a wide variety of compositions and structures designed to confine lattice defects. In some embodiments, semiconductor buffer 105 may be a III-N layer interfacing with the non-III-N substrate 104. In an example, the semiconductor buffer 108 may comprise one or more GaN material layers, one or more AlN material layers, and/or the like.

In some embodiments, the device 100 may comprise a channel layer 110, which may be a first channel layer of the device 100. The channel layer 110 may be formed on the semiconductor buffer 108. In some embodiments, the channel layer 110 may comprises GaN. In some embodiments, the channel layer 110 may be binary alloy GaN, and may be substantially undoped to have a carrier mobility of about 1100 cm2/V*s, or more (or less). In some embodiments, the channel layer 110 may have a thickness of at least about 1 micrometer and no more than about 2 micrometers. In some embodiments, the channel layer 110 may have a thickness of at least about 0.5 micrometer and no more than about 2 micrometers.

A first source 128s1 and a first drain 128d1 may be formed adjacent to, and coupled to, the channel layer 110. The source 128s1 and drain 128d1 may be impurity doped semiconductor regions (e.g., with Si for n-type). The impurity doped semiconductor regions comprising the source 128s1 and drain 128d1 may be, for example, low bandgap group III-N material, such as In$_x$Ga$_{1-x}$N and/or InN, for low resistance, or may be simply n-type (e.g., Si-doped) GaN, where x may range from 0 to 0.2. In an example, the impurity doping level may be any typically employed for an N+ source/drain of a GaN device. For example, the source 128s1 and the drain 128d1 may have a dopant concentration of at least 1e18 atoms/cm3. For some embodiments, the raised doped N+ material may be substantially monocrystalline. Dislocation density within the source 128s1 and the drain 128d1 may be between $10^9$ cm-2 and $10^{12}$ cm-2, for example. Material having many orders of magnitude higher dislocation density is also possible, and in some embodiments source and drain regions 128s1 and 128d1 may be polycrystalline. Source and drain semiconductor may be of any composition known to be suitable for the device layer material compositions.

In some embodiments, the source 128s1 may be coupled to source metal contacts 132s1 and 134s1, and the drain 128d1 may be coupled to drain metal contacts 132d1 and 134d1. The metal contacts 132s1, 134s1, 132d1, and 134d1 may be of an ohmic metal, such as, but not limited to, a Ti/Au alloy.

In some embodiments, a polarization layer 116 may be formed over and adjacent to the channel layer 110. The polarization layer 116 may be coupled between the source 128s1 and the drain 128d1.

In some embodiments, the polarization layer 116 may include one or more polarization material, e.g., InAlGaN, AlN, AlInN, AlGaN, InGaN. For example, the polarization layer 116 may comprise In$_x$Al$_y$Ga$_{1-x-y}$N, with x between 0% and 20%, and y between 10% and 100%. Of particular utility may be In$_x$Al$_y$Ga$_{1-x-y}$N with composition, for example, of x being about 17% and y being about 83%, where the polarization layer may be lattice matched to GaN. Such an embodiment may prevent formation of stress (stress that may culminate from lattice mismatch between the polarization layer 116 and the GaN channel layer 110), e.g., as too much stress may induce formation of defects.

In some embodiments, the polarization layer 116 may create a two-dimensional electron gas (2DEG) region 114 within the channel layer 110, near the heterojunction of the polarization layer 116 and the channel layer 110. In some embodiments, the 2DEG region 114 may exist near the interface of the channel layer 110 and the polarization layer 116, e.g., extending about 3-4 nm into the channel layer 110. In an example, the source 128s1 and the drain 128d1 may be electrically coupled through the 2DEG region 114.

In some embodiments, the device 100 may further comprise a channel layer 112, which may be formed over the polarization layer 116 (e.g., formed on the polarization layer 116). The channel layer 112 may be a second channel layer of the device 100. In some embodiments, another polarization layer 120 may be formed over and adjacent to the channel layer 112.

In some embodiments, the channel layer 112 may comprises GaN. In some embodiments, the channel layer 112 may be binary alloy GaN, and may be substantially undoped to have a carrier mobility of about 1100 cm2/V*s, or more (or less). In some embodiments, the channel layer 112 may have a thickness of at least about 10 nanometer (nm) and no more than 50 nm. Thus, the channel layer 110 may be substantially thicker than the channel layer 112.

In some embodiments, the polarization layer 120 may include one or more polarization material, e.g., InAlGaN, AlN, AlInN, AlGaN, InGaN. For example, the polarization layer 120 may comprise In$_x$Al$_y$Ga$_{1-x-y}$N, with x between 0% and 20%, and y between 10% and 100%. Of particular utility may be In$_x$Al$_y$Ga$_{1-x-y}$N with composition, for example, of x being about 17% and y being about 83%, where the polarization layer may be lattice matched to GaN.

In some embodiments, the polarization layer 116 may have a thickness of at least about 10 nm and no more than 20 nm, and the polarization layer 120 may have a thickness of at least about 5 nm and no more than about 10 nm. In some embodiments, the polarization layer 116 may be thicker than the polarization layer 120. In some embodiments, the polarization layer 116 may have higher concentration of Al and In, e.g., compared to the respective concentration of Al and In of the polarization layer 120.

In some embodiments, the polarization layer 120 may create a 2DEG region 118 within the channel layer 112, near the heterojunction of the polarization layer 120 and the channel layer 112.

The polarization layer 120 may be coupled between a second source 128s2 and a second drain 128d2. The source 128s2 and drain 128d2 may be impurity doped semiconductor regions (e.g., with Si for n-type). The impurity doped semiconductor regions comprising the source 128s2 and drain 128d2 may be, for example, low bandgap group III-N material, such as $In_xGa_{1-x}N$ and/or InN, for low resistance, or may be simply n-type (e.g., Si-doped) GaN. In an example, the impurity doping level may be any typically employed for an N+ source/drain of a GaN device. For example, the source 128s2 and the drain 128d2 may have a dopant concentration of at least 1e18 atoms/cm3. For some embodiments, the raised doped N+ material may be substantially monocrystalline. Dislocation density within the source 128s2 and the drain 128d2 may be between 109 cm-2 and 1012 cm-2, for example. Material having many orders of magnitude higher dislocation density is also possible, and in some embodiments the source 128s2 and the drain 128d2 may be polycrystalline. Source and drain semiconductor may be of any composition known to be suitable for the device layer material compositions.

In an example, the source 128s2 and the drain 128d2 may not be connected or attached to the 2DEG region 118, e.g., due to the structure of the source 128s2 and the drain 128d2, as illustrated in FIG. 1. For example, the source 128s2 and the drain 128d2 may be separated from the 2DEG region 118 by sections of the polarization layer 120.

In some embodiments, the source 128s2 may be coupled to source metal contact 134s2, and the drain 128d2 may be coupled to drain metal contact 134d2. The metal contacts 134s2 and 134d2 may be of an ohmic metal, such as, but not limited to, a Ti/Au alloy.

Various embodiments discussed herein assume an ohmic source and drain. However, in some other embodiments, the source/drain 128s2, 128d1, 128s2, 128d2 may comprise schottky contacts, as would be readily understood by those skilled in the art, based on the contents of this disclosure.

In some embodiments, the device 100 may further comprise a gate stack 138g recessed into the polarization layer 120, e.g., to tune a threshold voltage (Vt) of the device 100. The gate stack 138g may include a gate electrode 142g that may be any metal or semiconductor known to have suitable conductivity and work function. In an example, the gate electrode 142g may be a work function metal that may be a mid-gap metal, such as, but not limited to TiN, or slightly p-type, such as, but not limited to a Ni/Au alloy. The gate electrode 142g may electrostatically couple to the channel layer 112 through the field effect. The gate stack 138g may further include a gate dielectric 140 (symbolically illustrated using a thick line), such as any high-k or conventional dielectric material known to be suitable for III-N FETs or III-N devices. For example, the gate dielectric 140 may be a material that has a bulk dielectric constant of 7, or more. In some embodiments, gate dielectric 140 may be Al2O3. Other dielectric materials, such as, but not limited to group III-ON, and other high-k dielectrics such as Gd2O3, HfO2, Ta2O5, ZrO2, high-K metal silicates such as HfOSiO, TaSiyOx, AlSiO, and other high-K oxynitrides such as HfON, AlON, ZrSiON, HfSiON may also be suitable as gate dielectric 140.

In some embodiments, the device 100 may also comprise isolation dielectric material 122 and 136, which may comprise low k dielectric material (although only some instances of the isolation dielectric material are labeled in FIG. 1).

Although two 2DEG regions are illustrated to be formed in the device 100, multiple (e.g., three, four, or even higher) such 2DEG regions may also be formed in the device 100. For example, each such 2DEG region may be associated with a corresponding channel layer and a corresponding polarization layer.

Although FIG. 1 and various other figures of this disclosure illustrate multiple 2DEG regions (e.g., regions 114 and 118), in some embodiments (and although not shown in the figures), instead of (or in addition to) forming the multiple 2DEG regions, multiple 2-dimensional hole gas (2DHG) regions may also be formed. For example, a first 2DHG region may replace the 2DEG region 114, and a second 2DHG region may replace the 2DEG region 118. For example, in such embodiments, appropriate material for the channel layers 110 and/or 112, and/or appropriate material for the polarization layers 116 and/or 120 may be used for creation of the two 2DHG regions in the channel layers 110 and/or 112. For the case with 2DHG, the crystal orientation of channel layers 110 and 112, and the polarization layers 116 and 120, may be inverted compared to that of the case with 2DEG. The crystal inversion may be accomplished by known epitaxial GaN growth techniques or by flipping the crystal upside down followed by a layer transfer. Thus, for example, one or more 2DEG regions illustrated in one or more figures of this disclosure may be replaced by one or more corresponding 2DHG regions.

Figure 2:
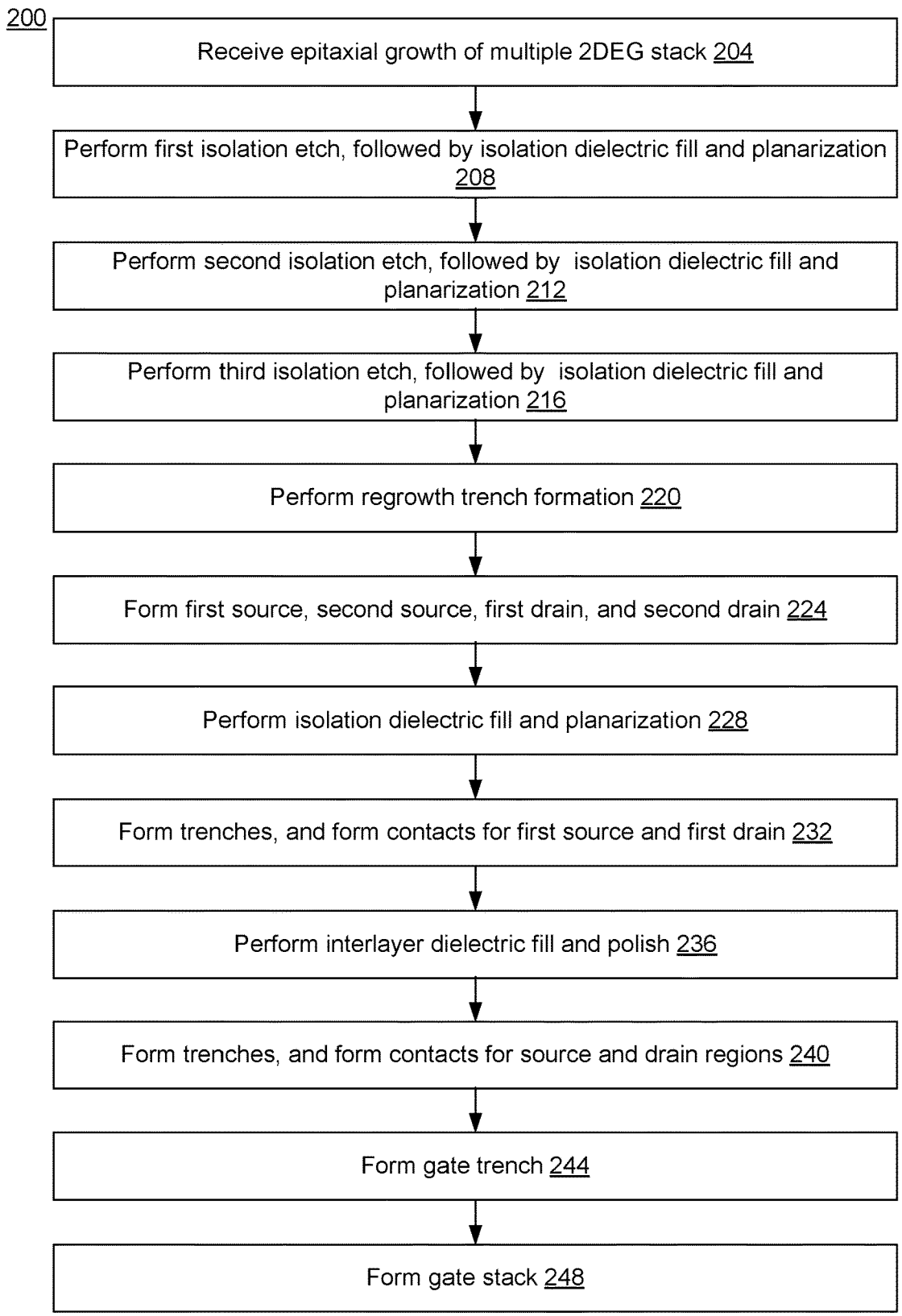
FIG. 2 is a flow diagram illustrating methods of forming the device structure of FIG. 1, in accordance with some embodiments.
Figure 3A:
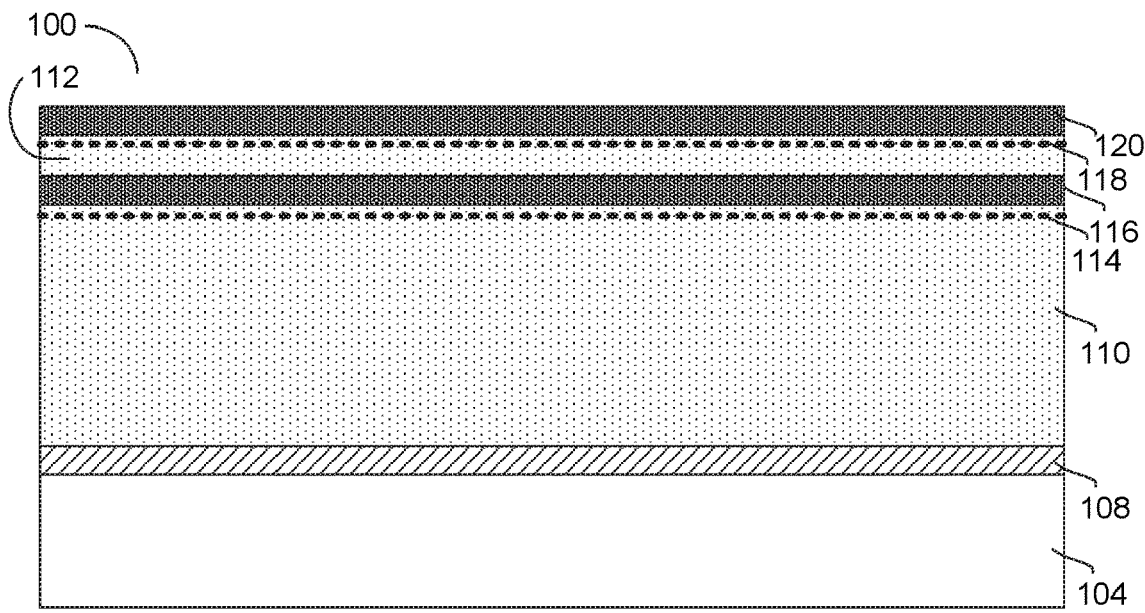
FIGS. 3A-3P are cross-sectional views of the device of FIG. 1 evolving as selected operations in the methods of FIG. 2 are performed, in accordance with some embodiments.

FIG. 2 is a flow diagram illustrating methods 200 of forming the device structure 100 of FIG. 1, in accordance with some embodiments. FIGS. 3A-3P are cross-sectional views of the device 100 evolving as selected operations in the methods 200 are performed, in accordance with some embodiments.

Methods 201 of FIG. 2 begin at operation 204, where an epitaxial growth of multiple 2DEG stack is received. An example of such a stack is illustrated in FIG. 3A, which may comprise the substrate 104, the semiconductor buffer 108 formed on the substrate 104, the channel layer 110 formed on the semiconductor buffer 108, the polarization layer 116 formed on the channel layer 110, the channel layer 112 formed on the polarization layer 116, and the polarization layer 120 formed on the channel layer 112. Also illustrated in FIG. 3A are the two 2DEG regions 114 and 118, which may be respectively formed on the channel layers 110 and 112.

Figure 3B:
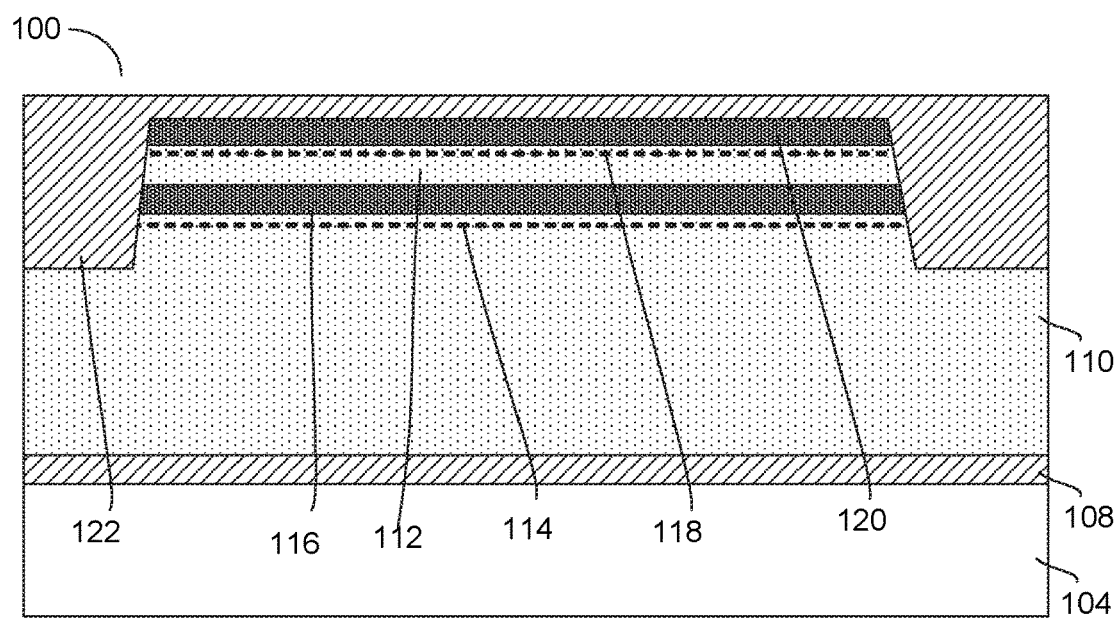

Referring again to FIG. 2, the methods 200 may continue at operation 208, where a first isolation etch may be performed, followed by isolation dielectric fill and planarization, as illustrated in FIG. 3B. For example, as illustrated in FIG. 3B, an etch may be performed to selectively remove sections of the channel layer 110, the polarization layer 116, the channel layer 112, and the polarization layer 120. Any appropriate etching techniques may be employed to selectively remove these layers, such as dry etch, wet chemical etch, etc. A top surface of the polarization layer 120, including the etched sections of the various layers, may be filled with isolation dielectric material 122, which may then be planarized, as illustrated in FIG. 3B.

Figure 3C:
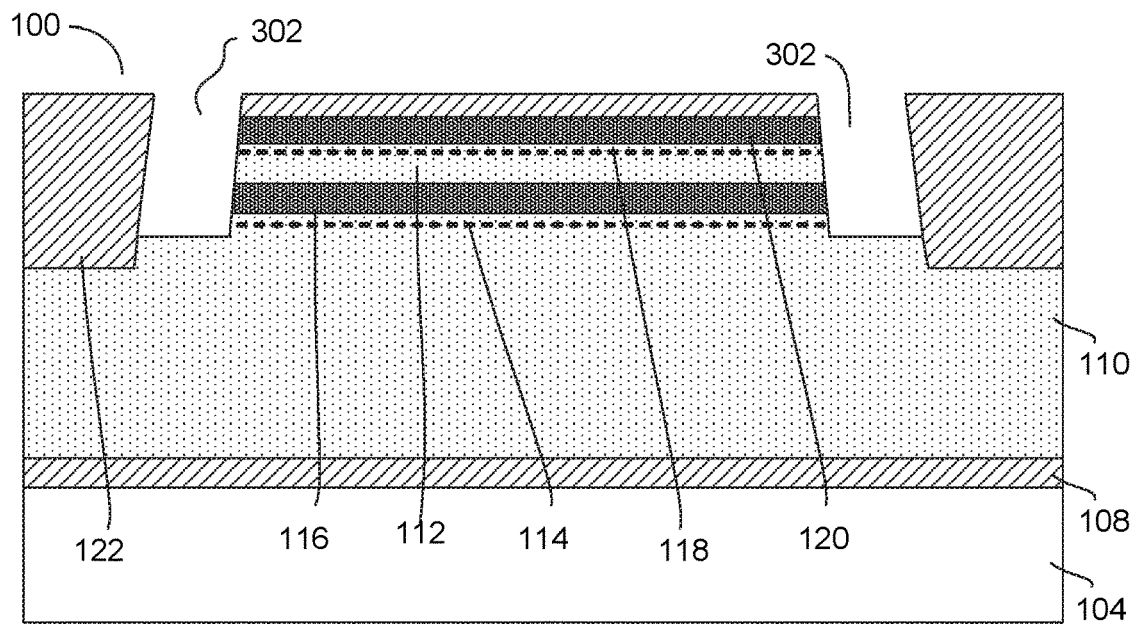
Figure 3D:
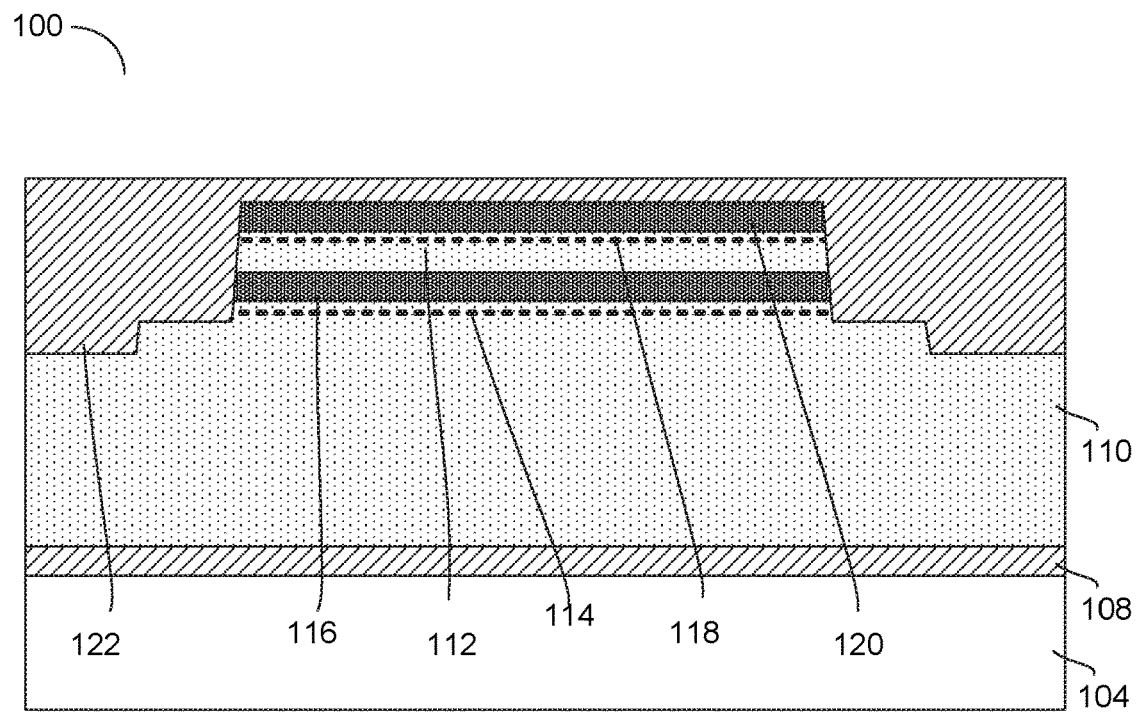

Referring again to FIG. 2, the methods 200 may continue at operation 212, where a second isolation etch may be performed, as illustrated in FIG. 3C. For example, as illustrated in FIG. 3C, trenches 302 may be formed by selectively etching sections of the channel layer 110, the polarization layer 116, the channel layer 112, the polarization layer 120, and the isolation dielectric material 122. Also, at operation 212, the second isolation etch may be followed by isolation dielectric fill and planarization, as illustrated in FIG. 3D. For example, as illustrated in FIG. 3D, the trenches 302 may be filled with isolation dielectric material 122, which may then be planarized.

Figure 3E:
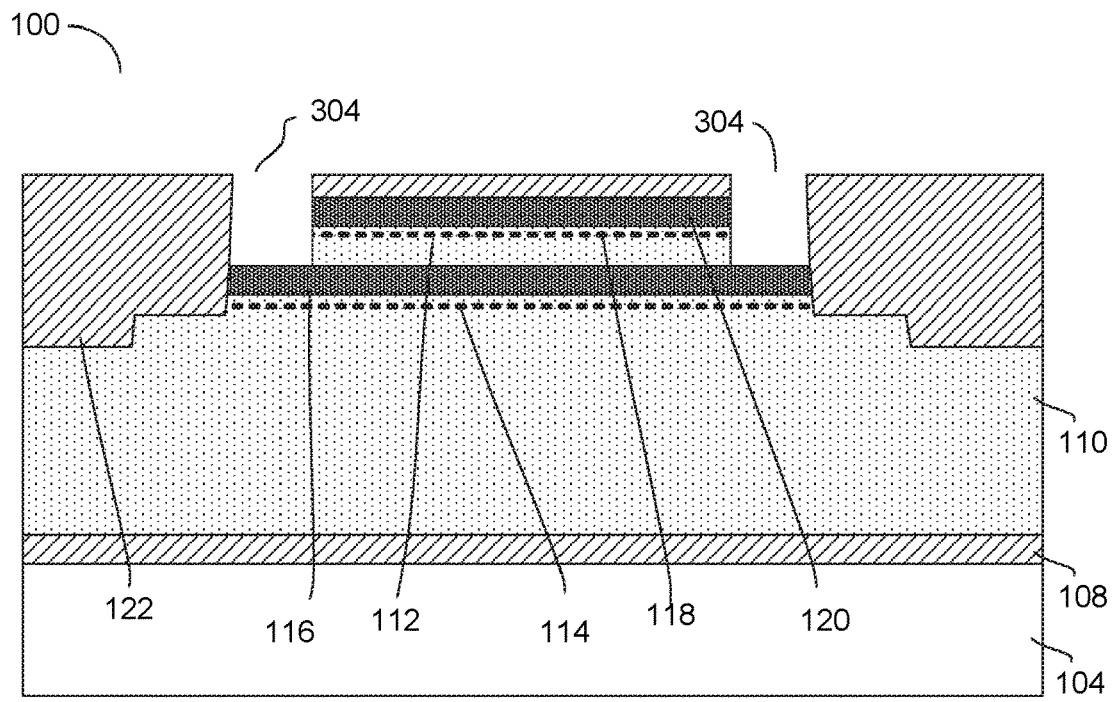

Referring again to FIG. 2, the methods 200 may continue at operation 216, where a third isolation etch may be performed, as illustrated in FIG. 3E. For example, as illustrated in FIG. 3E, trenches 304 may be formed by selectively etching sections of the channel layer 112, the polarization layer 120, and the isolation dielectric material 122. In some embodiments, the third isolation etch may be selectively performed (e.g., using selective etchant), e.g., such that the polarization layer 116 is not etched.

For example, the etching may be performed in two steps: a time etch to etch the isolation dielectric material 122, the polarization layer 120, and the channel layer 112; and a selective etch that may etch remaining portion of the channel layer 112, without etching the polarization layer 120. Any appropriate etchant for the selective etch may be used.

Figure 3F:
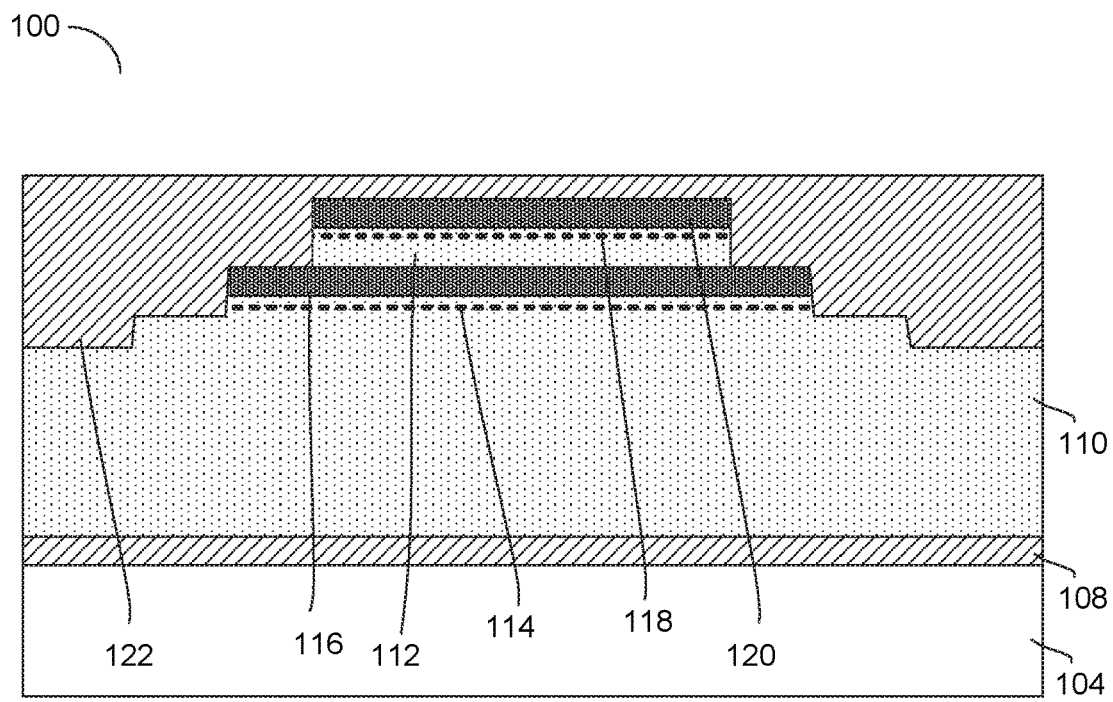

Also, at operation 216, the third isolation etch may be followed by isolation dielectric fill and planarization, as illustrated in FIG. 3F. For example, as illustrated in FIG. 3F, the trenches 304 may be filled with the isolation dielectric material 122, which may then be planarized.

Figure 3G:
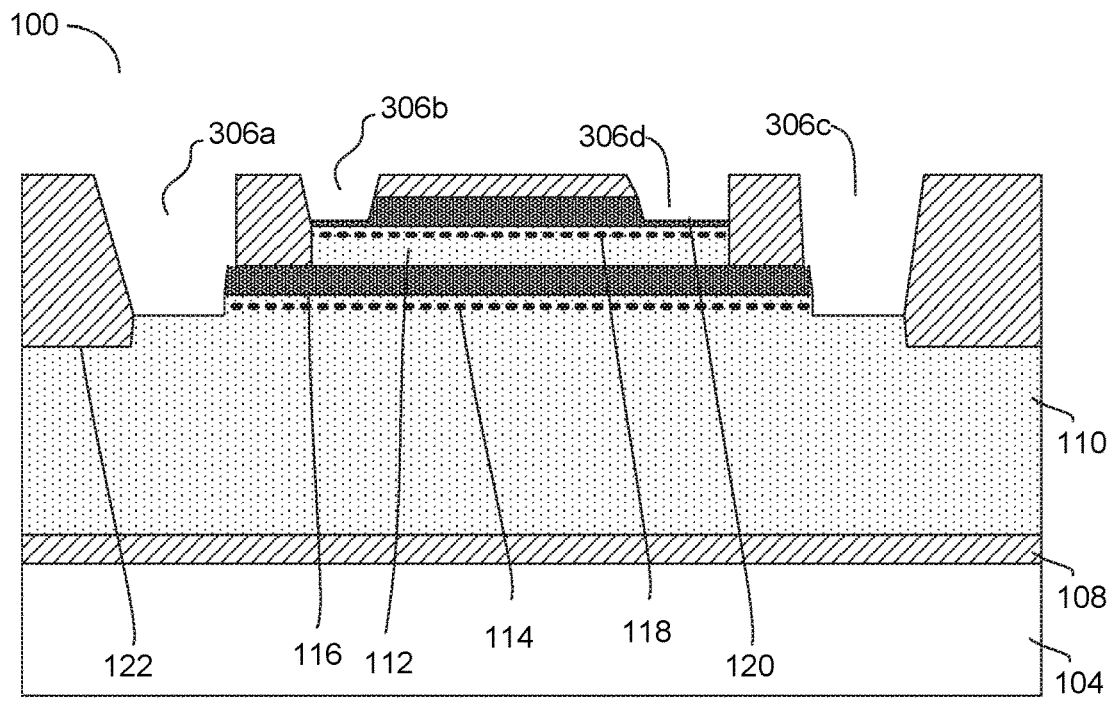

Referring again to FIG. 2, the methods 200 may continue at operation 220, where regrowth trench formation may be performed, as illustrated in FIG. 3G. For example, trenches 306a, 306b, 306c, and 306d may be formed by selectively etching the isolation dielectric material 122, e.g., for formation of source and drain regions.

Figure 3H:
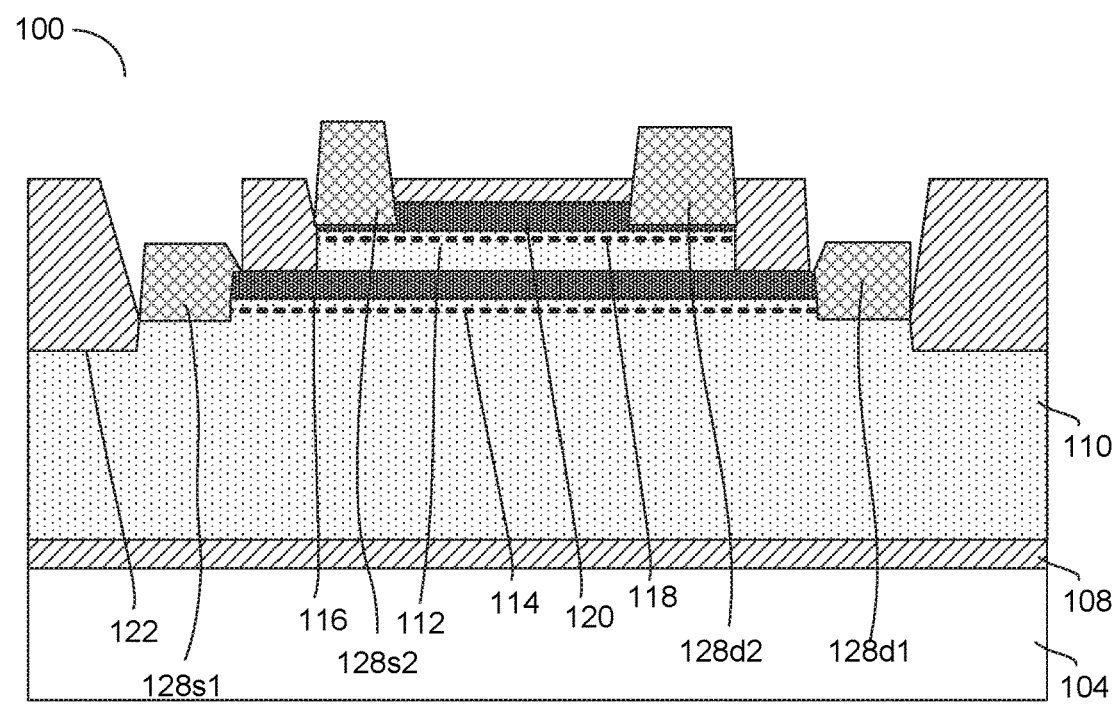

Referring again to FIG. 2, the methods 200 may continue at operation 224, where a first source 128s1, a second source 128s2, a first drain 128d1, and a second drain 128d2 (e.g., see FIG. 1) may be respectively formed on the trenches 306a, 306b, 306c, and 306d, as illustrated in FIG. 3H. Example properties of the source and drain have been discussed with respect to FIG. 1.

Figure 3I:
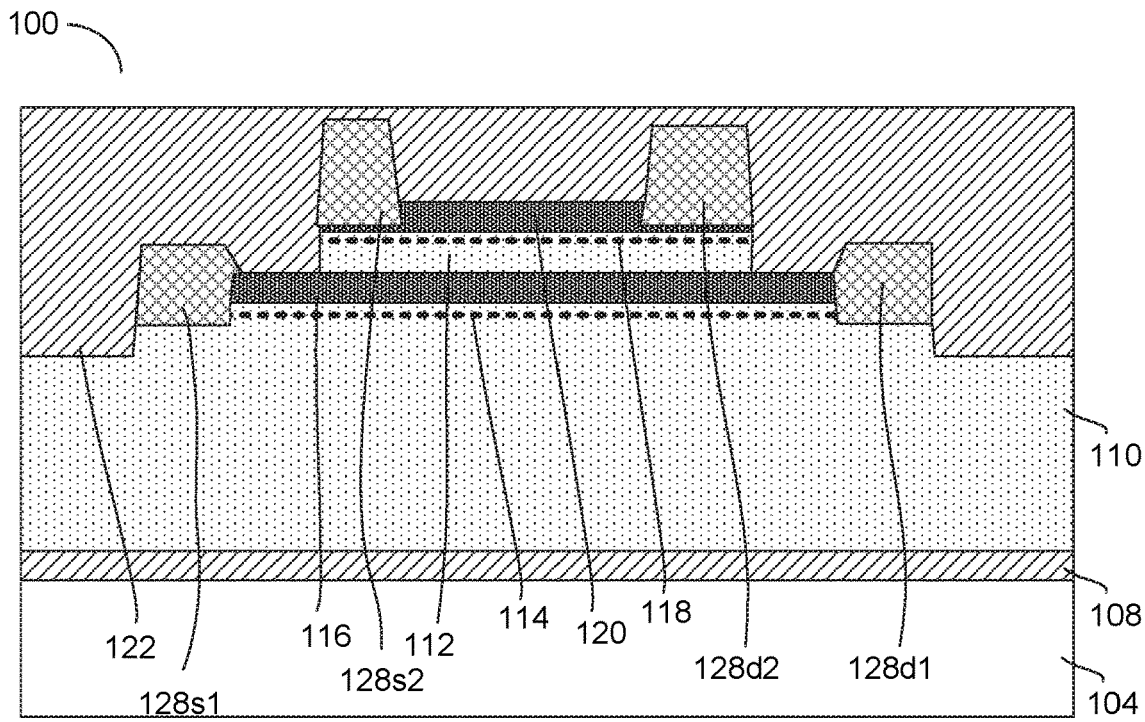

Referring again to FIG. 2, the methods 200 may continue at operation 228, where isolation dielectric fill and planarization may be performed, as illustrated in FIG. 3I. For example, the remaining portions of trenches 306a, ..., 306d (e.g., above the sources 128s1 and 128s2, and drains 128d1 and 128d2) may be overfilled with the isolation dielectric material 122, and the isolation dielectric material 122 may be planarized, as illustrated in FIG. 3I.

Figure 3J:
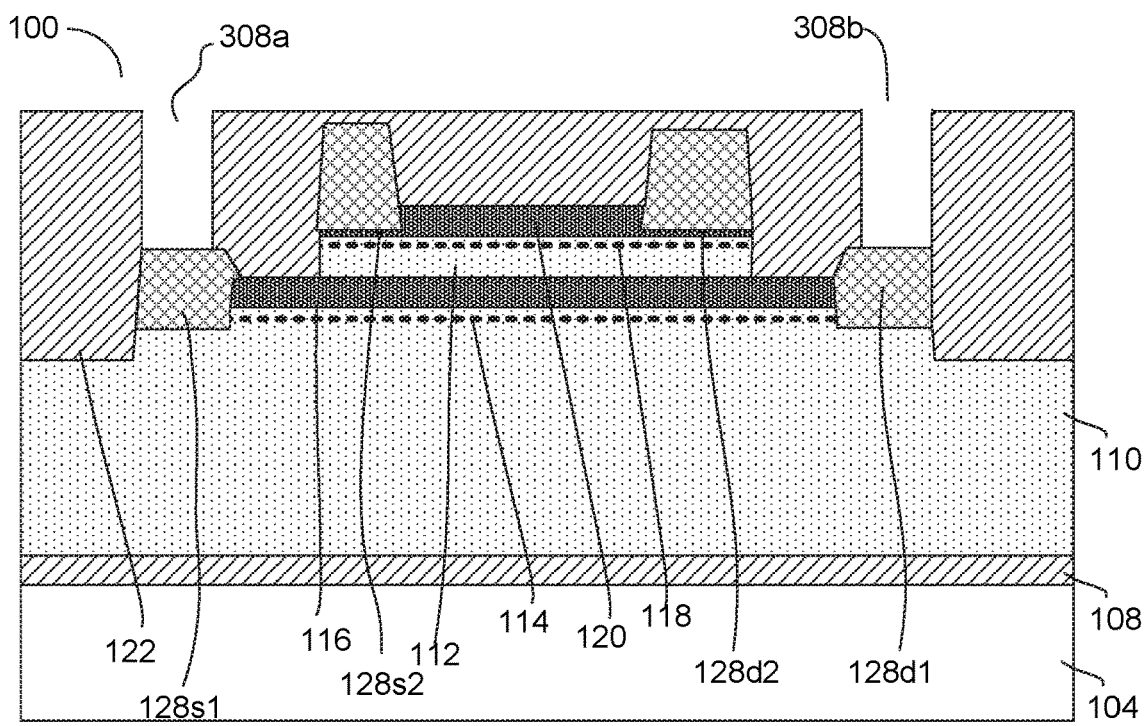
Figure 3K:
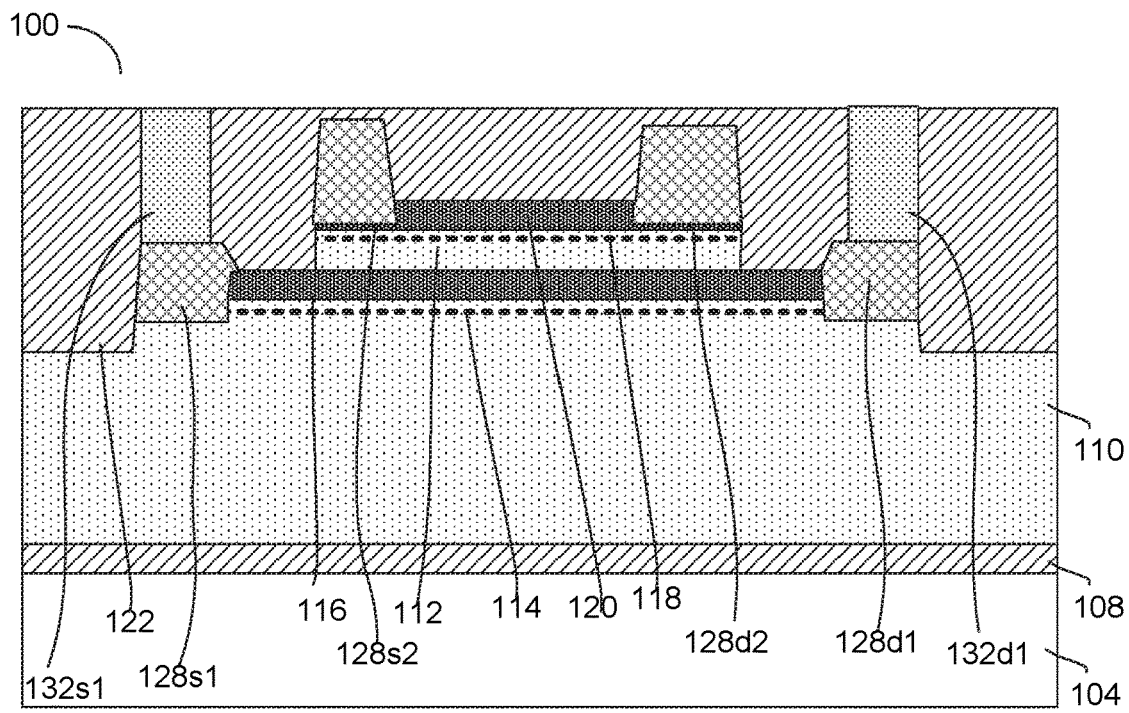

Referring again to FIG. 2, the methods 200 may continue at operation 232, where trenches 308a and 308b may be formed (e.g., above the source 128s1 and drain 128d1), e.g., selectively etching the isolation dielectric material 122, as illustrated in FIG. 3J. Also at 232, contacts for source 128s1 and drain 128d1 may be formed within the trenches 308a and 308b, as illustrated in FIG. 3K. For example, contact 132s1 and contact 132d1 may be respectively formed above the source 128s1 and drain 128d1. For example, the contacts 132s1 and 132d1 may be formed by metal fill in the respectively trenches 308a and 308b, followed by polishing of the metal.

Figure 3L:
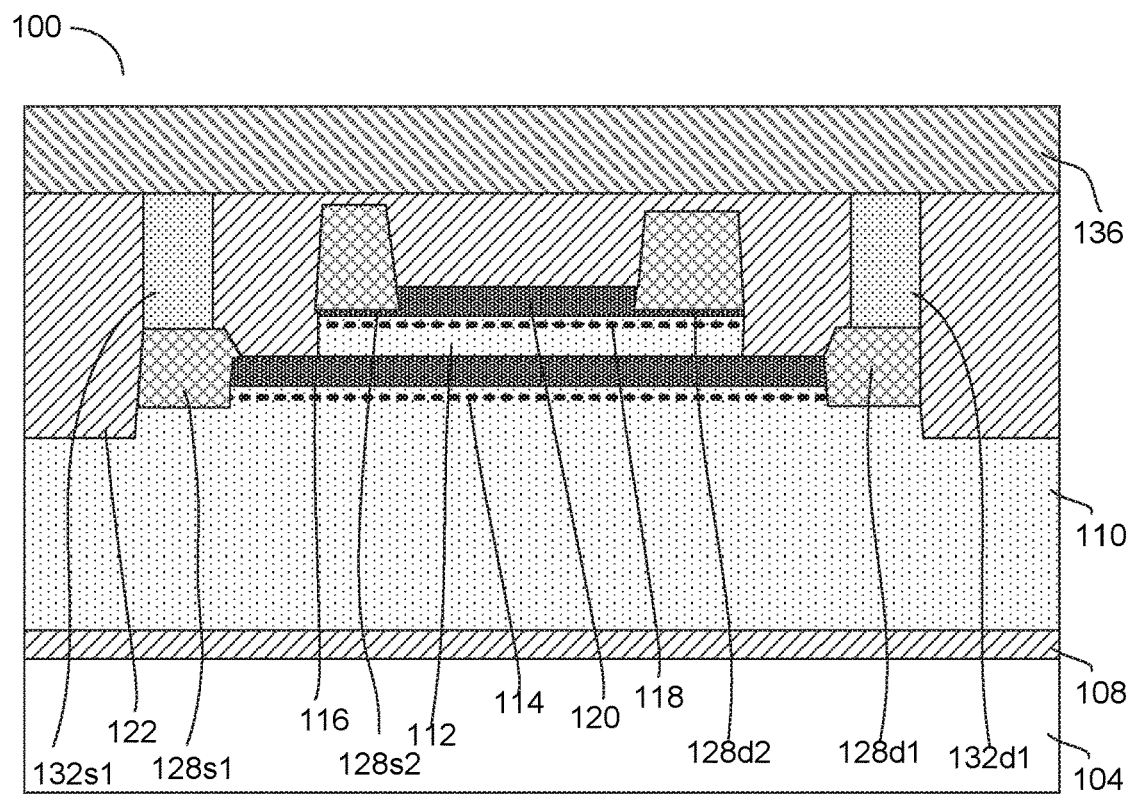

Referring again to FIG. 2, the methods 200 may continue at operation 236, where interlayer dielectric material 136 may be deposited over the isolation dielectric material 122, and polished, as illustrated in FIG. 3L.

Figure 3M:
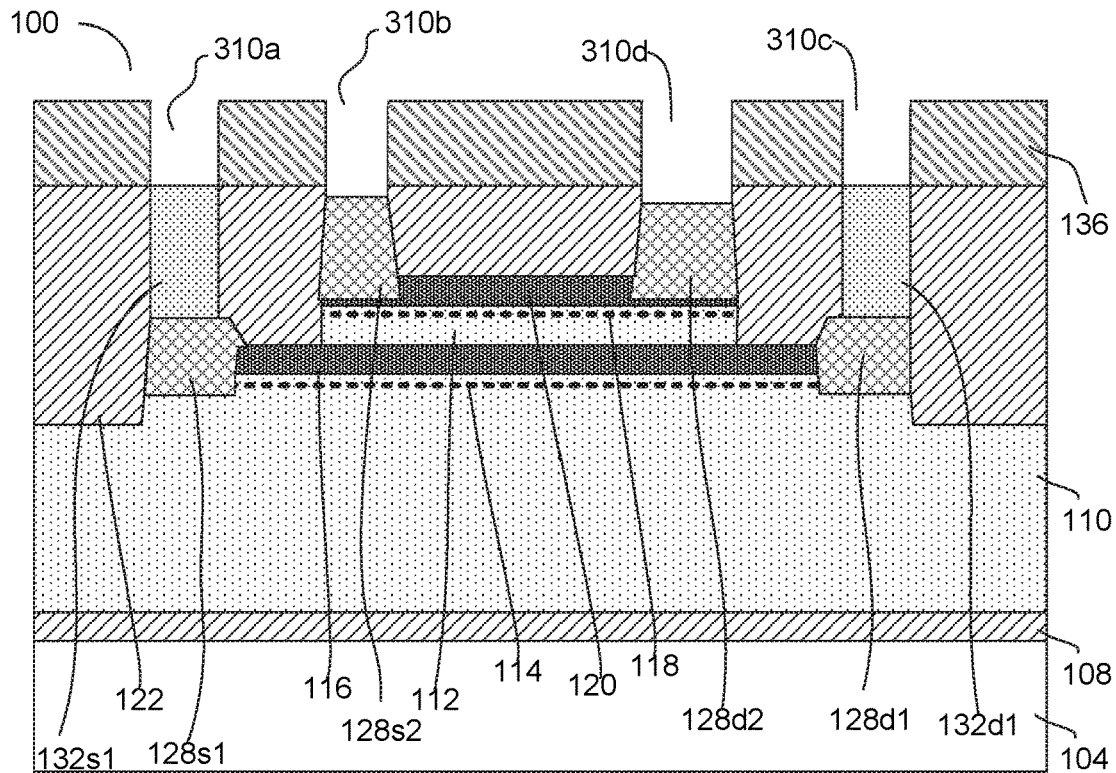
Figure 3N:
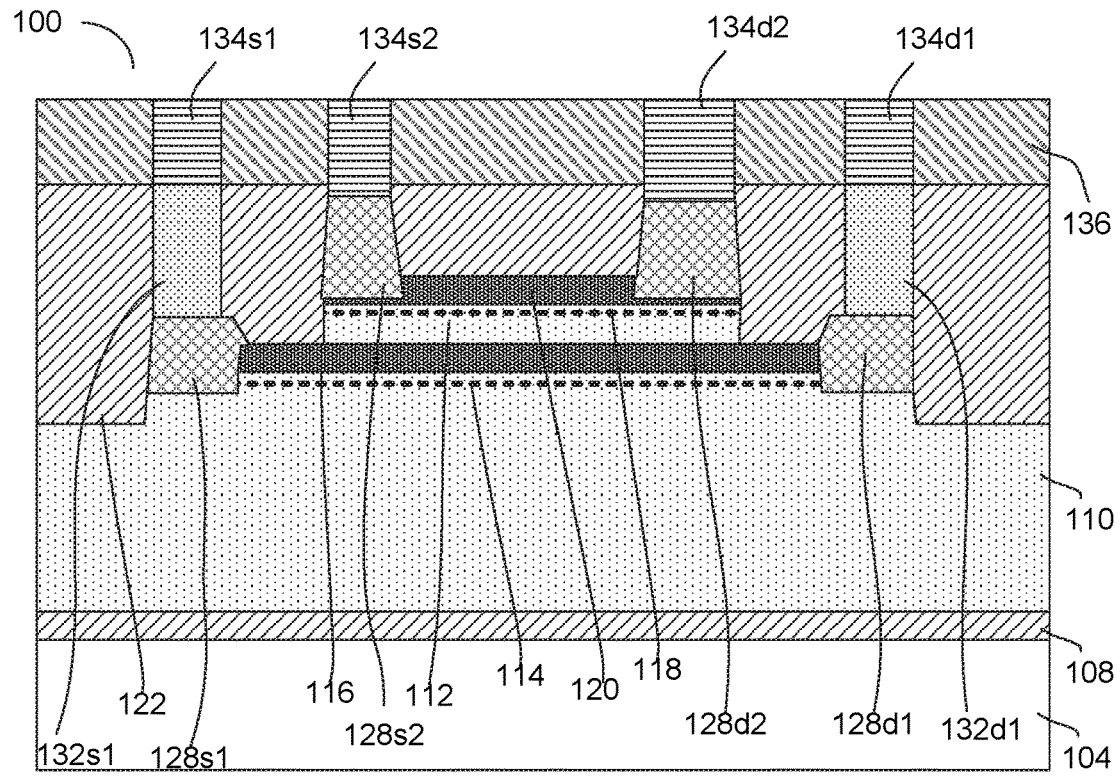

Referring again to FIG. 2, the methods 200 may continue at operation 240, where trenches 310a, 310b, 310c, and 310d may be formed on the dielectric material 136, e.g., respectively above the source contact 132s1, the source 128s2, the drain contact 132d1, and the drain 128d2, as illustrated in FIG. 3M. Also at 240, metal contacts 134s1, 134s2, 134d1, and 134d2 may be formed within the trenches 310a, 310b, 310c, and 310d, respectively, as illustrated in FIG. 3N. For example, the contacts 134s1, 134s2, 134d1, and 134d2 may be formed by metal fill in the respectively trenches, followed by polishing of the metal.

Thus, as illustrated in FIG. 3N (and also in FIG. 1), contacts 132s1 and 134s1, in combination, form a source contact for the source 128s1; contacts 132d1 and 134d1, in combination, form a drain contact for the drain 128d1; contact 134s2 forms a source contact for the source 128s2; and contact 134d2 forms a drain contact for the drain 128d2.

Figure 3O:
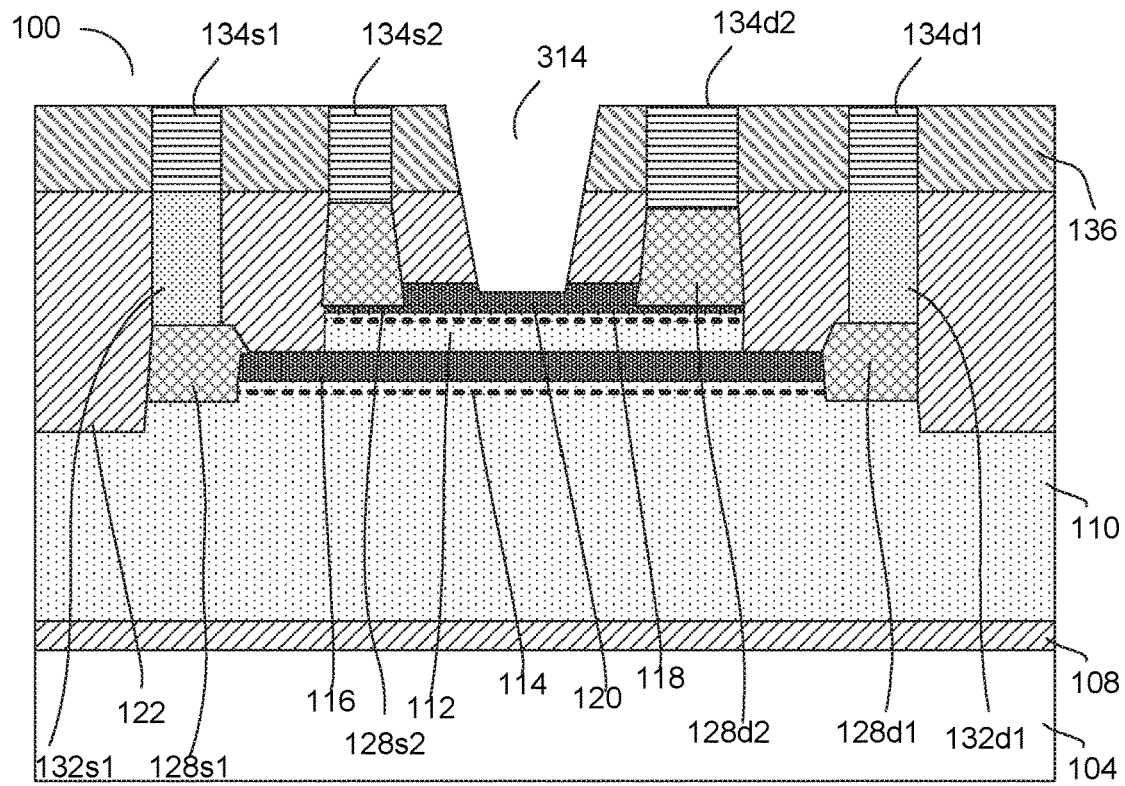
Figure 3P:
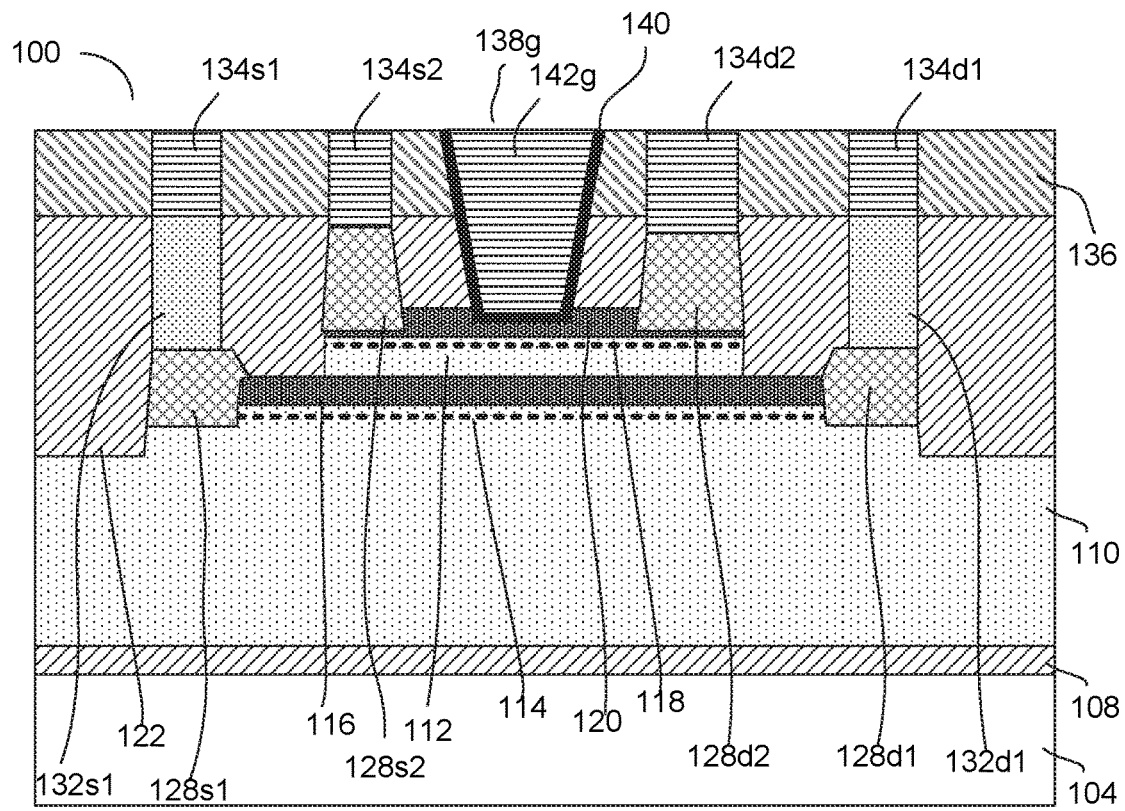

Referring again to FIG. 2, the methods 200 may continue at operation 244, where a gate trench 314 may be formed above the polarization layer 120, as illustrated in FIG. 3O. For example, the gate trench 314 may be recessed into the polarization layer 120, and may be formed by selectively removing the dielectric material 136 and 122, and the polarization layer 120. At 248, the gate stack 138g may be formed in the gate trench 314, as illustrated in FIG. 3P. As discussed with respect to FIG. 1, the gate stack 138g may comprise gate electrode 142g and may optionally comprise gate dielectric 140. The structure of the device 100 in FIG. 3P may be similar to the device 100 in FIG. 1, thereby completing the process of forming the device 100.

Figure 4:
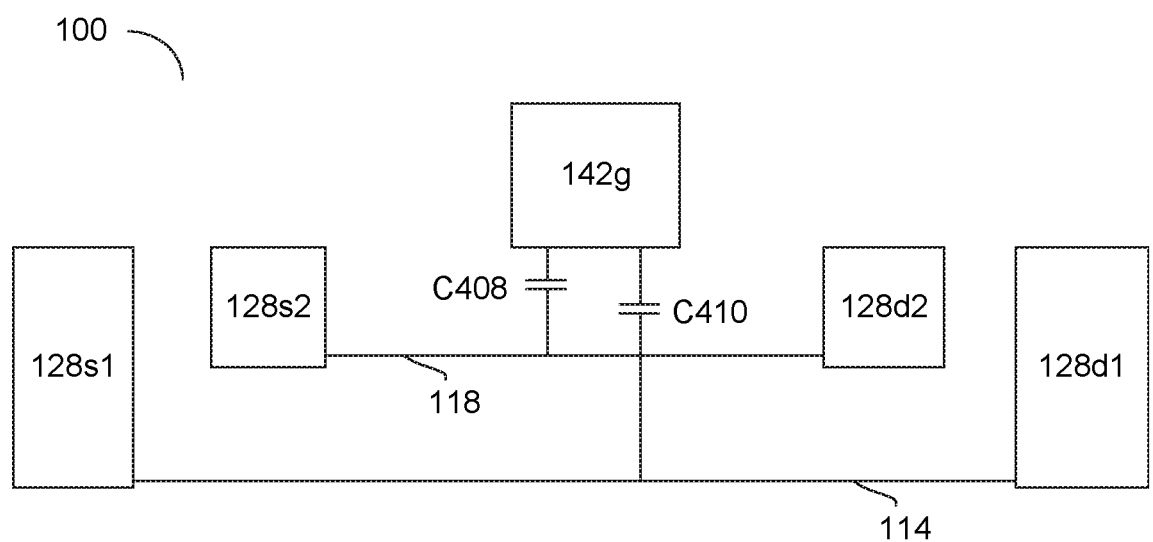
FIG. 4 illustrates an example operation of the device of FIG. 1, in accordance with some embodiments.

FIG. 4 illustrates an example operation of the device 100 of FIG. 1, in accordance with some embodiments. In FIG. 4, only some of the components of the device 100 is illustrated schematically. For example, FIG. 4 illustrates the source regions 128s1 and 128s2, the drain regions 128d1 and 128d2, the gate electrode 142g, the 2DEG region 114 between the source 128s1 and drain 128d1, and the 2DEG region 118 between the source 128s2 and drain 128d2. In some embodiments, when appropriate voltage is supplied to the gate electrode 142g, a capacitance may be induced between the gate electrode 142g and the 2DEG region 114, represented as C410 (also referred to as bottom capacitance). Similarly, in some embodiments, when appropriate voltage is supplied to the gate electrode 142g, a capacitance may be induced between the gate electrode 142g and the 2DEG region 118, represented as C408 (also referred to as top capacitance). The capacitance of the capacitors 408 and 410 may be fine-tuned, e.g., by tuning the voltage of the gate electrode 142g, and/or the voltages of the source and drain regions 128s1, 128s2, 128d1, 128d2.

In some embodiments, two of the source and drain regions 128s1, 128s2, 128d1, 128d2 may be electrically coupled to form a first node, and another two of the source and drain regions 128s1, 128s2, 128d1, 128d2 may be electrically coupled to form a second node (although such couplings are not illustrated in FIG. 4). The voltages to various source and drain regions and the gate electrode 142g may be varied to tune a capacitance between such first and second nodes, thereby forming a variable capacitance device.

Merely as an example, the source 128*s*1 and the drain 128*d*1 may be coupled (e.g., connected by an external connection not illustrated in FIG. 4) to form a first node; and the source 128*s*2 and the drain 128*d*2 may be coupled (e.g., connected by another external connection not illustrated in FIG. 4) to form a second node. In such an example, the capacitors 408 and 410 may be coupled in series between the two nodes. In some embodiments, voltages to the first node, the second node, and/or the gate electrode 142*g* may be controlled to tune a capacitance between the first and second nodes, thereby forming a variable capacitance device.

Figure 5:
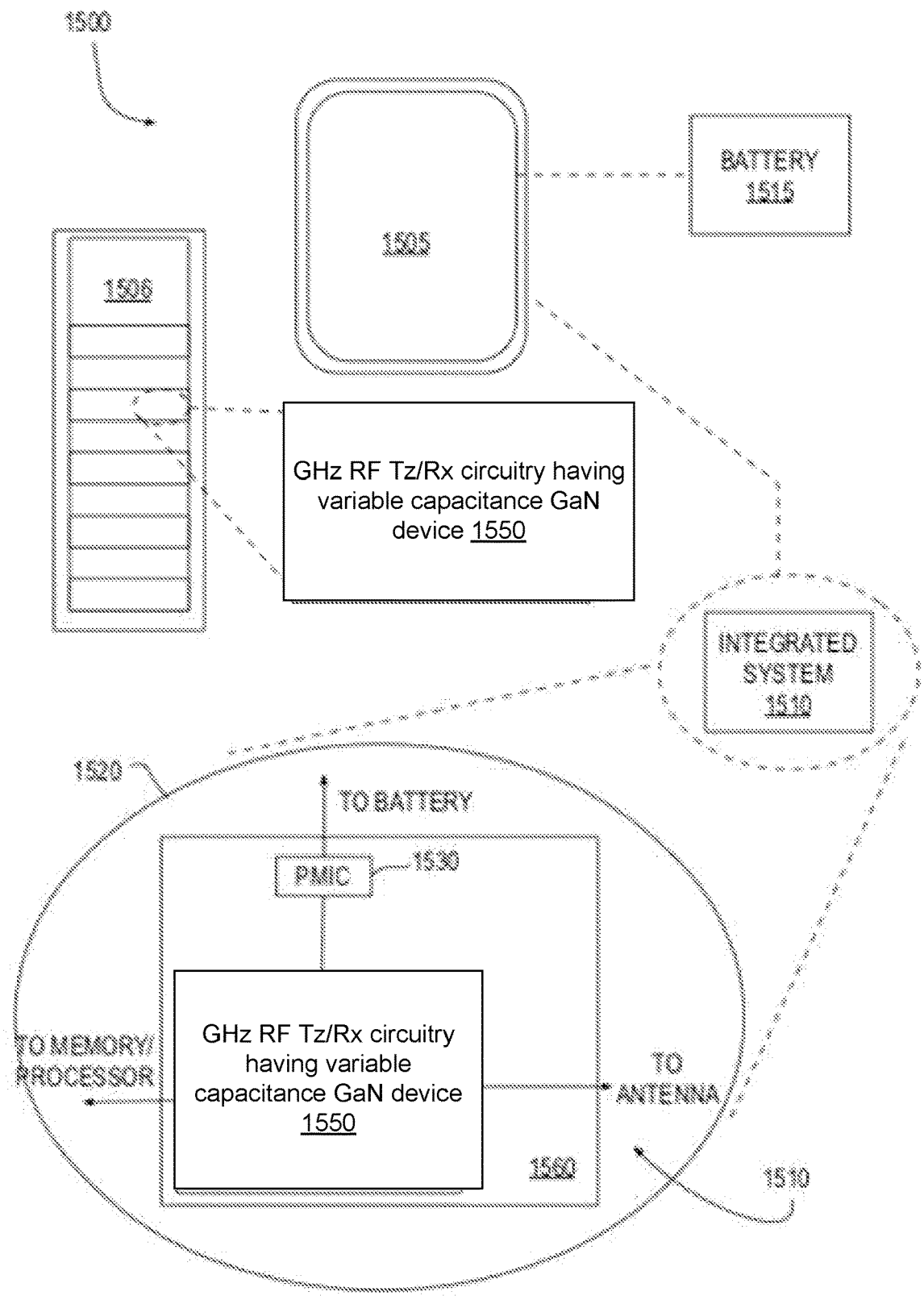
FIG. 5 illustrates a system in which a mobile computing platform and/or a data server machine employs an IC including at least one GaN device with variable capacitance, in accordance with some embodiments.

FIG. 5 illustrates a system 1500 in which a mobile computing platform 1505 and/or a data server machine 1506 employs an IC including at least one GaN device with variable capacitance, in accordance with some embodiments. The server machine 1506 may be any commercial server, for example including any number of high-performance computing platforms disposed within a rack and networked together for electronic data processing, which in the exemplary embodiment includes a packaged monolithic IC 1550. The mobile computing platform 1505 may be any portable device configured for each of electronic data display, electronic data processing, wireless electronic data transmission, or the like. For example, the mobile computing platform 1505 may be any of a tablet, a smart phone, laptop computer, etc., and may include a display screen (e.g., a capacitive, inductive, resistive, or optical touchscreen), a chip-level or package-level integrated system 1510, and a battery 1515.

Whether disposed within the integrated system 1510 illustrated in the expanded view 1520, or as a stand-alone packaged chip within the server machine 1506, the IC 1550 includes at least one variable capacitance GaN device, for example as describe elsewhere herein. The IC 1550 may be further coupled to a board, a substrate, or an interposer 1560 along with a power management integrated circuit (PMIC). Functionally, PMIC 1530 may perform battery power regulation, DC-to-DC conversion, etc., and so has an input coupled to battery 1515 and with an output providing a current supply to other functional modules.

IC 1550, in some embodiments, includes RF (wireless) integrated circuitry (RFIC) further including a wideband RF (wireless) transmitter and/or receiver (TX/RX including a digital baseband and an analog front end module comprising a power amplifier on a transmit path and a low noise amplifier on a receive path). The RFIC includes at least one III-N HFET adjacent to a substrate tap, for example as describe elsewhere herein. The RFIC has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 6:
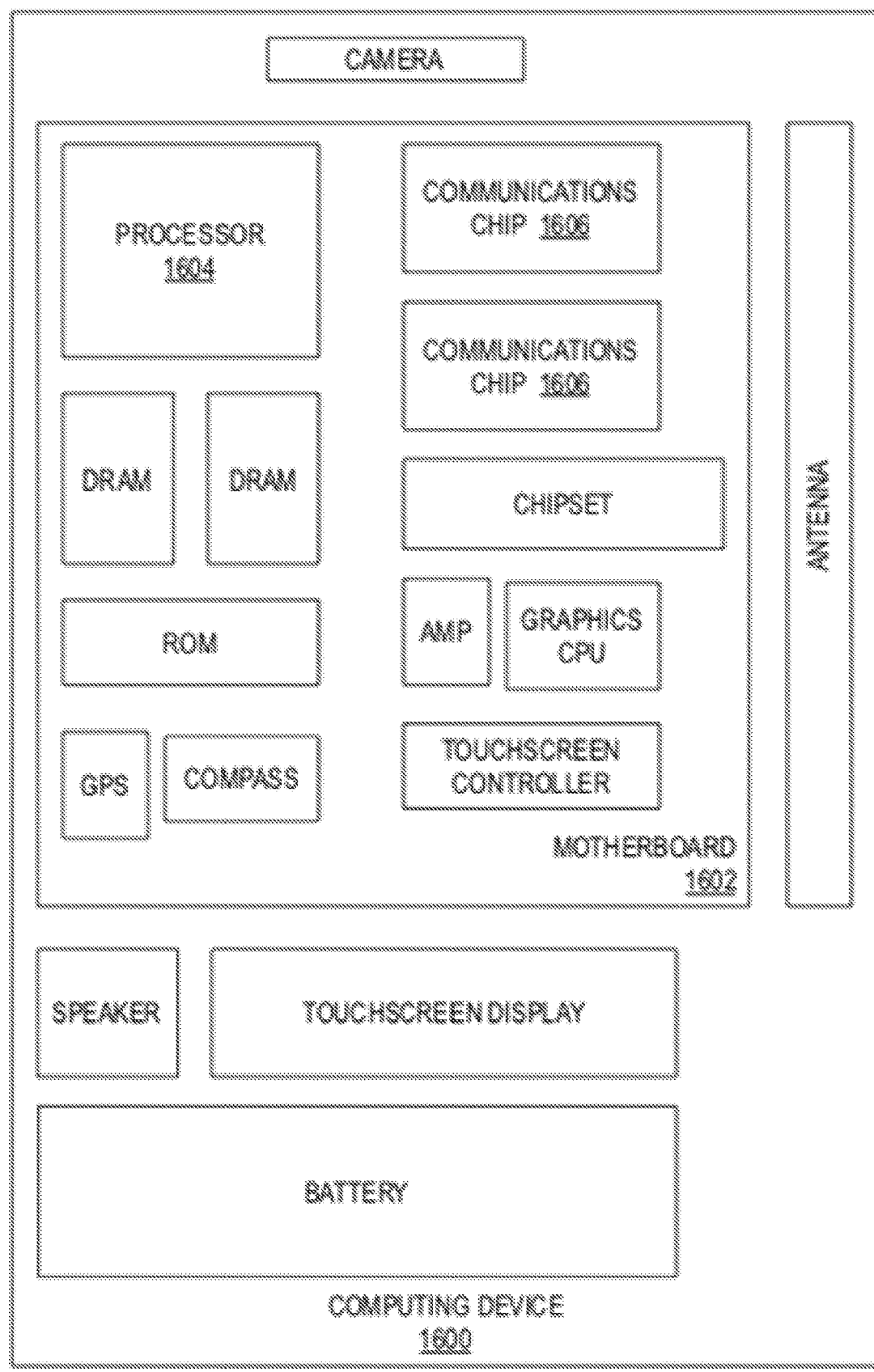
FIG. 6 is a functional block diagram of a computing device, arranged in accordance with at least some implementations of the present disclosure.

FIG. 6 is a functional block diagram of a computing device 1600, arranged in accordance with at least some implementations of the present disclosure. Computing device 1600 may be found inside platform 1505 or server machine 1506, for example. Device 1600 further includes a motherboard 1602 hosting a number of components, such as, but not limited to, a processor 1604 (e.g., an applications processor), which may further incorporate at least one variable capacitance GaN device, in accordance with embodiments of the present invention. Processor 1604 may be physically and/or electrically coupled to motherboard 1602. In some examples, processor 1604 includes an integrated circuit die packaged within the processor 1604. In general, the term "processor" or "microprocessor" may refer to any device or portion of a device that processes electronic data from registers and/or memory to transform that electronic data into other electronic data that may be further stored in registers and/or memory.

In various examples, one or more communication chips 1606 may also be physically and/or electrically coupled to the motherboard 1602. In further implementations, communication chips 1606 may be part of processor 1604. Depending on its applications, computing device 1600 may include other components that may or may not be physically and electrically coupled to motherboard 1602. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1606 may enable wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1606 may implement any of a number of wireless standards or protocols, including but not limited to those described elsewhere herein. As discussed, computing device 1600 may include a plurality of communication chips 1606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided in the following examples.

Example 1

An apparatus comprising: a first source and a first drain; a first polarization layer adjacent to the first source and the first drain; a first channel layer coupled to the first source and the first drain and adjacent to the first polarization layer, the first channel layer comprising a first two-dimensional electron gas (2DEG) region; a second source and a second drain; a second polarization layer adjacent to the second source and the second drain; and a second channel layer coupled to the second source and the second drain and adjacent to the second polarization layer, the second channel layer comprising a second 2DEG region, wherein the second channel layer is over the first polarization layer.

Example 2

The apparatus of example 1 or any other example, further comprising: a gate electrode coupled to the second polarization layer.

Example 3

The apparatus of example 2 or any other example, wherein the first polarization layer or the first channel layer is not attached to the gate electrode.

Example 4

The apparatus of example 2 or any other example, wherein the gate electrode is coupled to the first polarization layer by a gate dielectric.

Example 5

The apparatus of any of examples 1-4 or any other example, wherein individual ones of the first polarization layer and the second polarization layer comprises group III-nitride (III-N) polarization material.

Example 6

The apparatus of any of examples 1-4 or any other example, wherein: the first polarization layer comprises $In_xAl_yGa_{1-x-y}N$, and the second polarization layer comprises $In_aAl_bGa_{1-a-b}N$, wherein the first polarization layer has higher concentration of Al and In compared to the respective concentration of Al and In of the second polarization layer.

Example 7

The apparatus of any of examples 1-4 or any other example, wherein: the first polarization layer has a thickness of at least 10 nanometer (nm) and no more than 20 nm; and the second polarization layer has a thickness of at least 5 nm and no more than 10 nm.

Example 8

The apparatus of any of examples 1-4 or any other example, wherein: the first 2DEG region has higher charge carrier density than the second 2DEG region.

Example 9

The apparatus of any of examples 1-4 or any other example, wherein: the first channel layer has a thickness of at least 0.5 micrometer and no more than 2 micrometers; and the second channel layer has a thickness of at least 10 nanometer (nm) and no more than 50 nm.

Example 10

The apparatus of any of examples 1-4 or any other example, wherein: the second 2DEG region does not contact or is not attached to one or both of the second source region or the second drain region.

Example 11

A variable capacitance device comprising: a first channel layer comprising GaN having a first two-dimensional electron gas (2DEG) region; a second channel layer comprising GaN having a second 2DEG region, wherein a thickness of the first channel layer is greater than a thickness of the second channel layer, and wherein the second channel layer is formed over the first channel layer; and a gate electrode coupled to the first 2DEG region.

Example 12

The variable capacitance device of example 11 or any other example, wherein the first 2DEG region has higher charge carrier density than the second 2DEG region.

Example 13

The variable capacitance device of example 11 or any other example, further comprising: a substrate; and a buffer layer formed over the substrate, wherein the second channel layer is formed over the buffer layer.

Example 14

The variable capacitance device of any of examples 11-13 or any other example, further comprising: a first polarization layer over the first channel layer; and a second polarization layer over the second channel layer.

Example 15

The variable capacitance device of example 14 or any other example, wherein: the gate electrode is recessed in the first polarization layer, and is not adjacent to the second polarization layer.

Example 16

The variable capacitance device of example 14 or any other example, wherein: the first polarization layer comprises $In_xAl_yGa_{1-x-y}N$, and the second polarization layer comprises $In_aAl_bGa_{1-a-b}N$, wherein the first polarization layer has higher concentration of Al and In compared to the respective concentration of Al and In of the second polarization layer.

Example 17

The variable capacitance device of any of examples 11-13 or any other example, further comprising: a first source and a first drain coupled to the first channel layer; and a second source and a second drain coupled to the second channel layer.

Example 18

The variable capacitance device of example 17 or any other example, wherein: the first source and the first drain comprises heavily-doped III-N material having a n-type impurity dopant concentration.

Example 19

A method comprising: epitaxially growing a first channel layer over a substrate, a first polarization layer on the first channel layer, a second channel layer over the first polarization layer, and a second polarization layer over the second channel layer, wherein the first channel layer comprises a first two-dimensional electron gas (2DEG) region and the second channel layer comprises a second 2DEG region; forming a first source and a first drain adjacent to the first polarization layer; and forming a second source and a second drain adjacent to the second polarization layer.

Example 20

The method of example 19 or any other example, further comprising: forming a gate stack to be recessed in the second polarization layer.

Example 21

The method of any of examples 19-20 or any other example, further comprising: electrically coupling two of: the first source, the first drain, the second source, and the second drain; and electrically coupling remaining two of: the first source, the first drain, the second source, and the second drain.

Example 22

The method of any of examples 19-20 or any other example, further comprising: electrically coupling the first source and the first drain, to form a first node; and electrically coupling the second source and the second drain, to form a second node.

Example 23

The method of example 22 or any other example, further comprising: controlling a voltage of the gate stack, to tune a capacitance between the first node and the second node.

Example 24

An apparatus comprising: means for performing the method of any of the examples 19-23 or any other example.

Example 25

An apparatus comprising: means for epitaxially growing a first channel layer over a substrate, a first polarization layer on the first channel layer, a second channel layer over the first polarization layer, and a second polarization layer over the second channel layer, wherein the first channel layer comprises a first two-dimensional electron gas (2DEG) region and the second channel layer comprises a second 2DEG region; means for forming a first source and a first drain adjacent to the first polarization layer; and means for forming a second source and a second drain adjacent to the second polarization layer.

Example 26

The apparatus of example 25 or any other example, further comprising: means for forming a gate stack to be recessed in the second polarization layer.

Example 27

The apparatus of any of examples 25-26 or any other example, further comprising: means for electrically coupling two of: the first source, the first drain, the second source, and the second drain; and means for electrically coupling remaining two of: the first source, the first drain, the second source, and the second drain.

Example 28

The apparatus of any of examples 25-26 or any other example, further comprising: means for electrically coupling the first source and the first drain, to form a first node; and means for electrically coupling the second source and the second drain, to form a second node.

Example 29

The apparatus of example 28 or any other example, further comprising: means for controlling a voltage of the gate stack, to tune a capacitance between the first node and the second node.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

We claim:

1. An apparatus comprising:
a first source and a first drain;
a first polarization layer adjacent to the first source and the first drain;
a first channel layer coupled to the first source and the first drain and adjacent to the first polarization layer, the first channel layer comprising a two-dimensional (2D) carrier gas;
a second source and a second drain;
a second polarization layer over the first polarization layer and the first channel layer, and adjacent to the second source and the second drain;
a second channel layer coupled to the second source and the second drain and adjacent to the second polarization layer, the second channel layer comprising the 2D carrier gas, wherein the second channel layer is over the first polarization layer and the first channel layer; and
a gate electrode over the second channel layer.

2. The apparatus of claim 1, wherein the gate electrode has a first capacitance with the 2D carrier gas of the first channel layer and a second capacitance with the 2D carrier gas of the second channel layer.

3. The apparatus of claim 2, wherein the gate electrode is coupled to the first polarization layer through a gate dielectric, and wherein the first polarization layer and at least a partial thickness of the second polarization layer is between the gate electrode and the first channel region.

4. The apparatus of claim 1, wherein the 2D carrier gas is a 2D electron gas.

5. The apparatus of claim 1, wherein the first polarization layer and the second polarization layer comprise a group III-nitride (III-N) material.

6. The apparatus of claim 1, wherein:
the first polarization layer comprises $In_xAl_yGa_{1-x-y}N$, and the second polarization layer comprises $In_aAl_bGa_{1-a-b}N$,
wherein the first polarization layer has higher concentration of Al and In than a respective concentration of Al and In of the second polarization layer.

7. The apparatus of claim 1, wherein:
the first polarization layer has a thickness of at least 10 nanometer (nm) and no more than 20 nm; and
the second polarization layer has a thickness of at least 5 nm and no more than 10 nm.

8. The apparatus of claim 1, wherein:
the 2D carrier gas of the first channel layer has higher charge carrier density than the 2D carrier gas of the second channel layer.

9. The apparatus of claim 1, wherein:
the first channel layer has a thickness of at least 0.5 micrometer and no more than 2 micrometers; and
the second channel layer has a thickness of at least 10 nanometer (nm) and no more than 50 nm.

10. The apparatus of claim 1, wherein:
the first source and drain are directly connected at a first circuit node;
the second source and drain are directly connected at a second circuit node; and
the gate electrode is coupled to a third circuit node.

11. The apparatus of claim 1, further comprising:
a substrate; and
a buffer layer formed over the substrate,
wherein the second channel layer is formed over the buffer layer.

12. The apparatus of claim 1, wherein the gate electrode is recessed in the second polarization layer.

13. The apparatus of claim 1, wherein the first source and the first drain comprises each comprise heavily-doped III-N material having a n-type impurity dopant concentration.

* * * * *